US012642060B2

(12) United States Patent
Levy et al.

(10) Patent No.: US 12,642,060 B2
(45) Date of Patent: May 26, 2026

(54) HEAT SPREADING ISOLATION STRUCTURE FOR SEMICONDUCTOR DEVICES

(71) Applicant: GLOBALFOUNDRIES U.S. Inc., Santa Clara, CA (US)

(72) Inventors: Mark D. Levy, Williston, VT (US); Siva P. Adusumilli, South Burlington, VT (US); Alvin J. Joseph, Williston, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 102 days.

(21) Appl. No.: 17/123,184

(22) Filed: Dec. 16, 2020

(65) Prior Publication Data

US 2022/0189821 A1     Jun. 16, 2022

(51) Int. Cl.
H01L 21/762          (2006.01)
H01L 21/763          (2006.01)
(Continued)

(52) U.S. Cl.
CPC ....... *H10P 90/1906* (2026.01); *H10D 86/201* (2025.01); *H10W 10/041* (2026.01);
(Continued)

(58) Field of Classification Search
CPC .......................... H01L 21/76264–76291; H01L 29/0649–0653; H01L 29/7812; H01L 29/7824; H01L 23/481; H01L 2225/06541–06544; H01L 2225/06548; H01L 21/76898; H01L 21/76254;
(Continued)

(56) References Cited

U.S. PATENT DOCUMENTS

| | | | |
|---|---|---|---|
| 5,313,094 A | * 5/1994 | Beyer | H01L 23/3732 |
| | | | 257/77 |
| 6,080,608 A | * 6/2000 | Nowak | H01L 23/3677 |
| | | | 257/E23.105 |

(Continued)

FOREIGN PATENT DOCUMENTS

EP          2395548 A1     12/2011

OTHER PUBLICATIONS

Okuyama et al., "High Dose Ion Implantation into Photoresist", Nippon Electric Company, Limited, IC Division, Kawasaki, Japan, Downloaded on May 8, 2016 to IP 130.203.136.75, pp. 1-6.

(Continued)

*Primary Examiner* — Julio J Maldonado
*Assistant Examiner* — Stanetta D Isaac
(74) *Attorney, Agent, or Firm* — Francois Pagette; Hoffman Warnick LLC

(57)          ABSTRACT

A structure includes an active device over an area of a substrate, and a heat spreading isolation structure adjacent the active device. The isolation structure includes a dielectric layer above a heat-conducting layer. The heat-conducting layer may include polycrystalline graphite. The heat-conducting layer provides a heat sink, which provides a high thermal conductivity path for heat with low electrical conductivity. The heat-conducting layer may extend into the substrate. The substrate may include an SOI substrate in which case the heat-conducting layer may extend through the buried insulator thereof.

14 Claims, 8 Drawing Sheets

(51) Int. Cl.

| | |
|---|---|
| *H01L 23/367* | (2006.01) |
| *H10D 86/00* | (2025.01) |
| *H10P 90/00* | (2026.01) |
| *H10W 10/00* | (2026.01) |
| *H10W 10/10* | (2026.01) |
| *H10W 10/40* | (2026.01) |
| *H10W 40/22* | (2026.01) |

(52) U.S. Cl.

CPC ....... *H10W 10/061* (2026.01); *H10W 10/181* (2026.01); *H10W 10/40* (2026.01); *H10W 40/22* (2026.01)

(58) Field of Classification Search

CPC ........... H01L 21/4871; H01L 21/76283; H01L 23/3738; H01L 23/367; H10D 86/201; H10P 90/1906; H10P 90/1916; H10W 10/041; H10W 10/061; H10W 10/181; H10W 10/40; H10W 10/014; H10W 10/17; H10W 40/22; H10W 40/253

See application file for complete search history.

(56) References Cited

U.S. PATENT DOCUMENTS

| | | | | |
|---|---|---|---|---|
| 6,288,426 | B1 | 9/2001 | Gauthier, Jr. et al. | |
| 7,651,897 | B2 | 1/2010 | Vashchenko et al. | |
| 8,592,244 | B2 | 11/2013 | Gambino et al. | |
| 9,530,711 | B2 | 12/2016 | Botula et al. | |
| 10,461,253 | B1 * | 10/2019 | Slovin .................. | H01L 45/144 |
| 2002/0033189 | A1 | 3/2002 | Macris | |
| 2005/0059238 | A1 * | 3/2005 | Chen ..................... | H01L 23/473 |
| | | | | 257/E23.105 |
| 2010/0019385 | A1 | 1/2010 | Bartley et al. | |
| 2012/0056330 | A1 * | 3/2012 | Lee ................... | H01L 21/76898 |
| | | | | 257/774 |
| 2013/0001655 | A1 | 1/2013 | Huang et al. | |
| 2013/0208426 | A1 * | 8/2013 | Kim ................... | H01L 25/0657 |
| | | | | 361/717 |
| 2017/0229367 | A1 * | 8/2017 | Ge ..................... | H01L 21/76877 |
| 2017/0346069 | A1 * | 11/2017 | Kojima ................. | C01B 32/205 |
| 2019/0393130 | A1 * | 12/2019 | Mahnkopf ............. | H01L 24/09 |
| 2020/0411411 | A1 * | 12/2020 | Hoffmeyer .......... | H01L 23/3675 |
| 2021/0141154 | A1 * | 5/2021 | Razdan ................. | H01L 21/486 |

OTHER PUBLICATIONS

Tanaka et al., "Impact of annealing on structural change in amorphous carbon: effect of Fe catalyst" Frontier Research Center and Interdisciplinary Graduate School of Science and Engineering, Tokyo Institute of Technology, Japan, p. 1.

Lim et al., "Increase in graphitization and electrical conductivity of glassy carbon nanowires by rapid thermal annealing", Journal of Alloys and Compounds 702 (2017) Elsevier B.V., pp. 465-471.

Balandin, "Thermal Properties of Graphene, Carbon Nanotubes and Nanostructured Carbon Materials", University of California—Riverside, Article in Nature Materials, DOI: 10.1038/nmat3064, Jul. 2011, pp. 1-38.

Teboho et al., "Thermal Conductivity of Graphite-Based Polymer Composites Provisional chapter Thermal Conductivity of Graphite-Based Polymer Composites" http://dx.doi.org/10.5772/intechopen. 75676, 2018, pp. 1-19.

* cited by examiner

HEAT SPREADING ISOLATION STRUCTURE FOR SEMICONDUCTOR DEVICES

BACKGROUND

The present disclosure relates to semiconductor devices, and more specifically, to a heat spreading isolation structure for semiconductor devices including a dielectric over a heat-conducting layer.

Heat buildup in semiconductor devices can degrade performance and reliability. Semiconductor-on-insulator (SOI) devices are especially susceptible to overheating because the main thermal conduction paths away from the SOI devices are through poor thermal conducting structures. For example, one main thermal conduction pathway is vertically downward through the relatively thick buried insulating layer of the SOI substrate. Dielectric layers are poor thermal conductors. Another main thermal conduction pathway is through wiring via small tungsten contacts, which are also poor thermal conductors. Providing improved thermal conductivity to semiconductor devices has proven challenging.

SUMMARY

An aspect of the disclosure is directed to a structure, comprising: an active device over an area of a substrate; and a heat spreading isolation structure adjacent the active device, wherein the isolation structure includes a dielectric layer above a heat-conducting layer.

Another aspect of the disclosure includes a heat spreading isolation structure, comprising: in a trench in a substrate and adjacent an active device on the substrate, a body including: a dielectric layer; and a polycrystalline graphite, heat-conducting layer below the dielectric layer.

An aspect of the disclosure related to a method, comprising: forming a trench between adjacent semiconductor active regions; forming a hydrocarbon-containing material in the trench; introducing a dopant into at least a portion of the hydrocarbon-containing material in the trench to convert the at least a portion of the hydrocarbon-containing material to a disordered graphite; converting the disordered graphite to a polycrystalline graphite, heat-conducting layer; and forming a dielectric layer over the polycrystalline graphite, heat-conducting layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
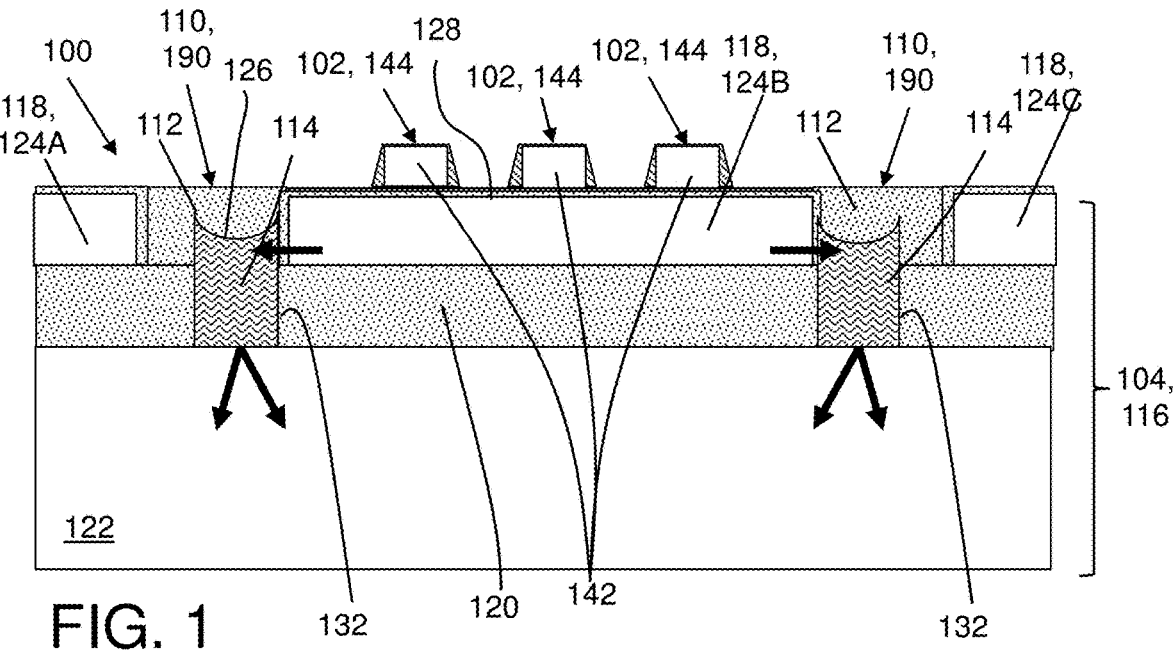
FIG. 1 shows a cross-sectional view of a structure including a heat spreading isolation structure in a metal-oxide semiconductor (MOS) environment, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure including an active device over an area of a substrate, and a heat spreading isolation structure adjacent the active device. The isolation structure includes a dielectric layer above a heat-conducting layer. The heat-conducting layer may include polycrystalline graphite. The heat-conducting layer provides a heat sink, which provides a high thermal conductivity path for heat with low electrical conductivity. The heat-conducting layer may extend into the substrate to direct heat thereto. The substrate may include an SOI substrate, in which case the heat-conducting layer may optionally extend through the buried insulating layer thereof. The heat spreading isolation structure provides short path conduction through dielectric layer(s) without the electrical/parasitic cost of other solutions.

FIG. 1 shows a cross-sectional view of a structure 100, according to embodiments of the disclosure. Structure 100 includes an active device 102 over an area of a substrate 104. Structure 100 also includes at least one heat spreading isolation structure 110 (two shown) adjacent active device 102 (three shown). Heat spreading isolation structure 110 includes a dielectric layer 112 above a heat-conducting layer 114. Substrate 104 may include a bulk semiconductor substrate (not shown in FIG. 1, see FIGS. 13-15), or a semiconductor-on-insulator (SOI) substrate 116. SOI substrate 116 includes a layered semiconductor-insulator-semiconductor substrate in place of a more conventional silicon substrate (bulk substrate). SOI substrate 116 includes a semiconductor-on-insulator (SOI) layer 118 over a buried insulating layer 120 over a base semiconductor substrate 122. Base semiconductor substrate 122 may also be referred to as a handle wafer. SOI layer 118 and base semiconductor substrate 122 may include but are not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Buried insulating layer 120 may include any appropriate dielectric such as but not limited to silicon dioxide, i.e., forming a buried oxide (BOX) layer. A portion of or the entire semiconductor substrate may be strained. The precise thickness of buried insulating layer 120 and SOI layer 118 may vary widely with the intended application.

In FIG. 1, heat spreading isolation structure 110 is in-between two portions of SOI layer 118, i.e., two semiconductor active regions 124A-B or 124B-C electrically isolated by the structure. In FIG. 1, heat spreading isolation structure 110, e.g., heat-conducting layer 114 thereof, extends through buried insulating layer 120. Heat-conducting layer 114 contacts base semiconductor substrate 122, thus providing a thermal conductive path from active device 102 to base semiconductor substrate 122. (Heat transmission is shown in the various drawings using heavier lined arrows). An upper surface 126 of heat-conducting layer 114 is not coplanar with an upper surface 128 of SOI layer 118. In FIG. 1, upper surface 128 of SOI layer 118 is above upper surface 126 of heat-conducting layer 114. Further, in a non-limiting example, as shown in FIG. 1, upper surface 126 of heat-conducting layer 114 may be concave.

Figure 2:
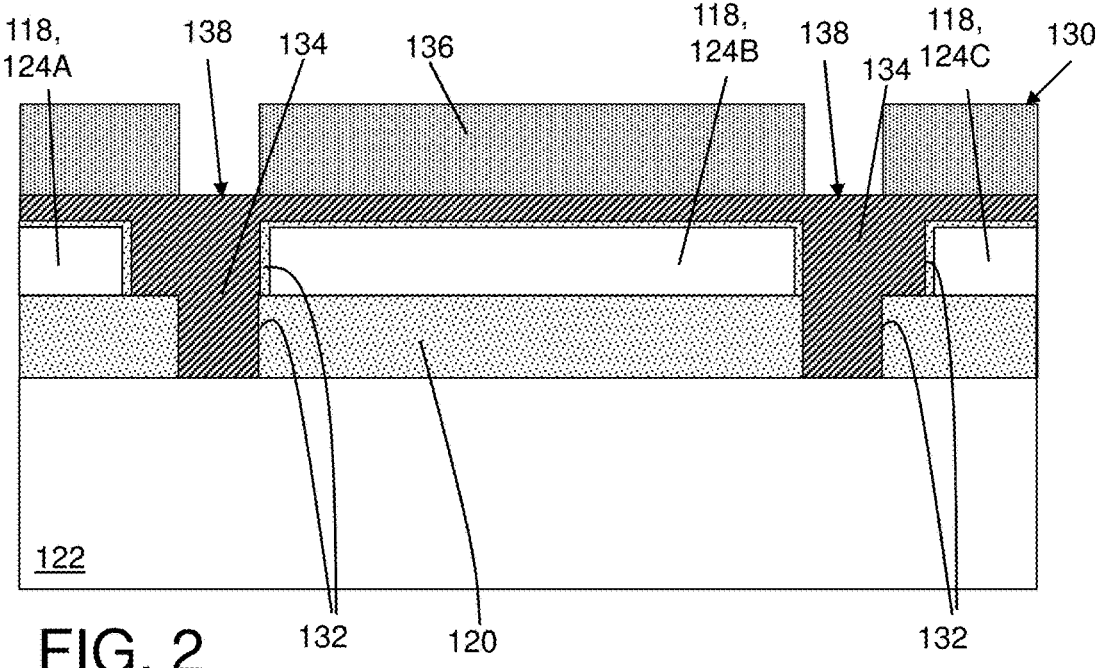
FIG. 2 shows a cross-sectional view of steps of a method, according to embodiments of the disclosure.
Figure 3:
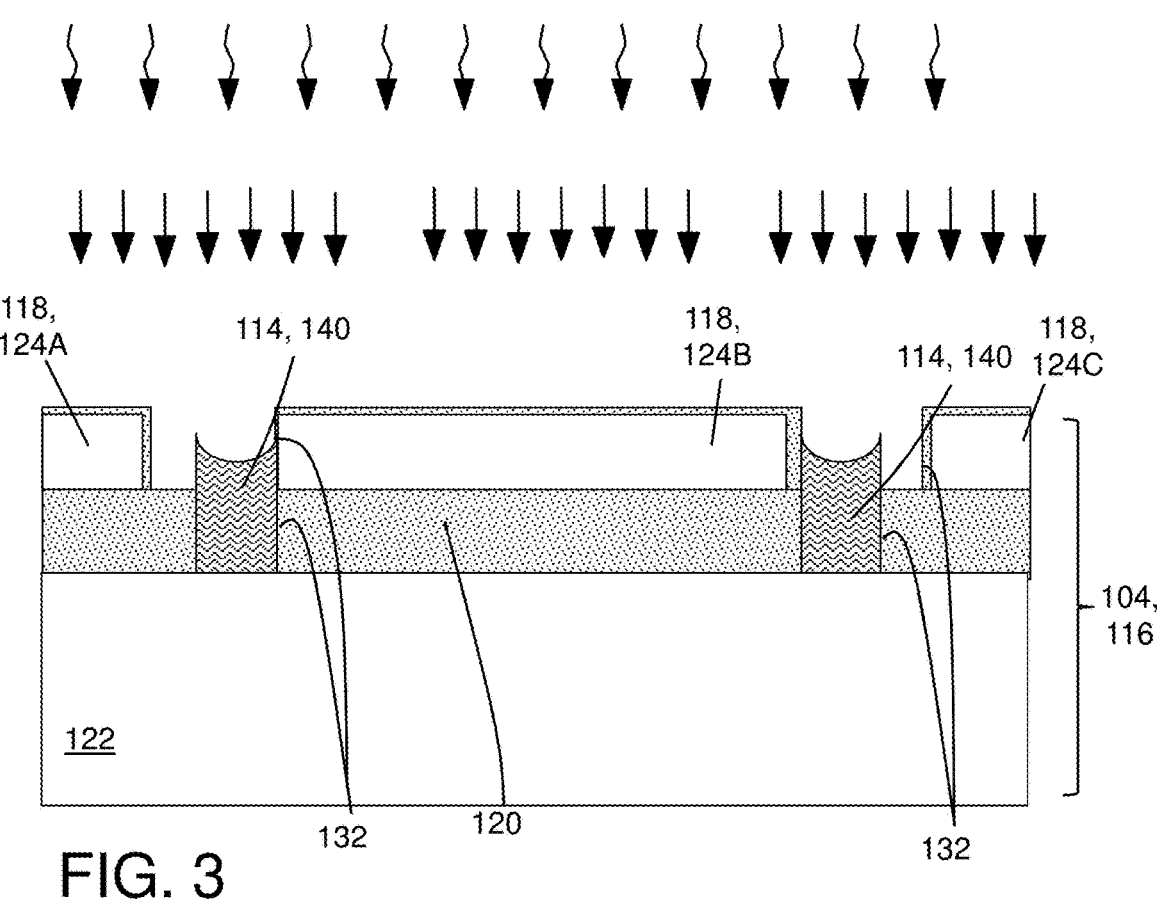
FIG. 3 shows a cross-sectional view of steps of the method, according to embodiments of the disclosure.

FIGS. 2-3, in combination with FIG. 1, show a method of forming heat spreading isolation structure 110, according to one embodiment of the disclosure. For purposes of description, the method will be described relative to a metal-oxide semiconductor (MOS) environment. It will understood, however, that the method and other teachings of the disclosures are equally applicable to bipolar devices and/or BiCMOS devices—see FIGS. 4 and 13-15. FIG. 2 shows a preliminary structure 130 including SOI substrate 104, as described herein.

Preliminary structure 130 is shown after semiconductor active region 124A-C forming, e.g., by patterning a mask and etching, and after oxide liner deposition. Hence, SOI layer 118 is separated into adjacent semiconductor active regions 124A-C.

Figure 7:
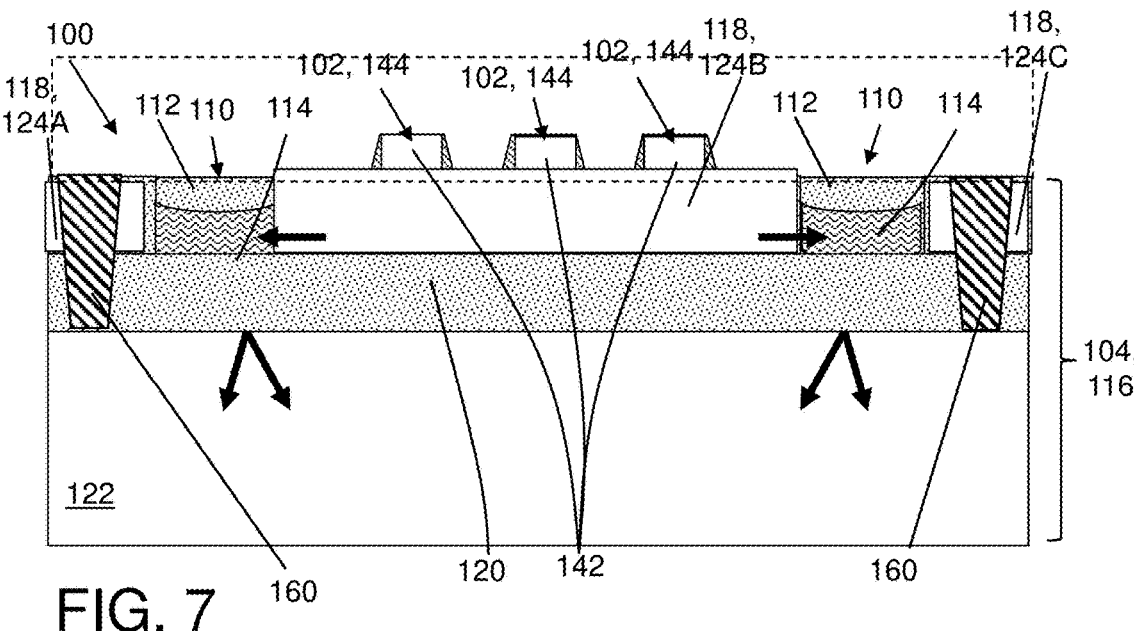
FIG. 7 shows a cross-sectional view of a structure including a heat spreading isolation structure, according to embodiments of the disclosure.

FIG. 2 also shows a number of steps of the method according to embodiments of the disclosure. FIG. 2 shows forming a trench 132 between adjacent semiconductor active regions 124A-B and 124B-C. Trench 132 may be formed within SOI substrate 116 in any now known or later developed manner, e.g., patterning a mask and etching. Trench(es) 132 may be located, for example, where trench isolations would normally be desired to electrically isolate semiconductor active regions 124A-C within SOI layer 118. Trench(es) 132 may be formed to any desired depth in SOI substrate 104 into which heat-conducting layer 114 is desired to extend. In FIG. 2, trench(es) 132 extend through buried insulating layer 120 to base semiconductor substrate 122, similar to that typically used for shallow trench isolations. In other embodiments, trench(es) 132 may extend into base semiconductor substrate 122 (FIG. 8) similar to that typically used for deep trench isolations, or trench(es) 132 may extend to a top of buried insulating layer 120 (FIG. 7).

As will also be described herein, a width of trenches 132 may also be controlled to select a width of heat-conducting layer 114.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features, such as trenches 132. The mask used to form trenches 132 is removed from FIG. 2, e.g., using any ashing process.

FIG. 2 also shows forming a hydrocarbon-containing material 134 in trench(es) 132. Hydrocarbon-containing material 134 may include any material including a hydrocarbon such as certain positive resist materials or anti-reflective coatings (ARC) that graphitize upon ion implanting with a relatively heavy ion such as an inert element like argon (Ar). For example, hydrocarbon-containing material 114 may include a positive resist material, such as an organic planarization layer (OPL). Hydrocarbon-containing material 134 may be deposited in any now known or later developed manner. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, for example, hydrocarbon-containing material 134 may be formed by spin-on applications.

FIG. 2 also shows forming a mask 136, exposing a portion 138 of hydrocarbon-containing material 134 in trench 132. Mask 136 exposes portion 138 at which heat-conducting layer 114 is desired to be formed. In one embodiment, shown in FIG. 2, portion 138 may have a smaller width than typical trench isolations, i.e., a width between active regions 124A-B or 124B-C in SOI layer 118. In other embodiments, portion 138 may have the same width as typical trench isolations, i.e., an entire width between active regions 124 in SOI layer 118—see FIG. 7. In any event, portion 138 is adjacent at least one of semiconductor active regions 124A-C, allowing thermal conduction between active regions 124A-C and heat-conducting layer 114 formed in portion 138.

FIG. 3 shows a cross-sectional view of the structure after a number of steps including introducing (straight arrows, e.g., ion implanting) a dopant into at least a portion 138 (FIG. 2) of hydrocarbon-containing material 134 (FIG. 2) to convert the at least a portion of the hydrocarbon-containing material to a disordered graphite. In the case of doping by implantation, a dosage and an energy level are specified and/or a resulting doping level may be specified. A dosage may be specified in the number of atoms per square centimeter (atoms/cm$^2$) and an energy level (specified in keV, kilo-electron-volts), resulting in a doping level (concentration in the substrate) of a number of atoms per cubic centimeter (atoms/cm$^3$). The number of atoms is commonly specified in exponential notation, where a number like "3E15" means 3 times 10 to the 15th power, or a "3" followed by 15 zeroes (3,000,000,000,000,000). To put things in perspective, there are about 1E23 (100,000,000, 000,000,000,000) atoms of hydrogen and oxygen in a cubic centimeter (cm3) of water. An example of doping is implanting with argon (Ar) with a dosage of between about 1E15 and 1E16 atoms/cm$^2$, and an energy of about 500 to 1000 keV to produce a doping level of between 1E17 and 1E18 atoms/cm$^3$ ("atoms/cm$^3$" may also be written "cm$^3$"). Although shown to extend to the full depth of hydrocarbon-containing material 134, the implanting dosage and energy level may be selected to create heat-conducting layer 114 to any desired depth in hydrocarbon-containing material 134 (FIG. 2). In non-limiting examples, the energy and dosage may be 900 keV and 5e14 cm$^3$; 500 kev and 2e15 cm$^3$; and/or 130 keV and 1e16 cm$^3$.

FIG. 3 also shows converting (curved arrows) the disordered graphite to a polycrystalline graphite 140, creating heat-conducting layer 114. The converting may include annealing, such as a rapid thermal anneal (RTA) process, and may have any temperature and duration required to create polycrystalline graphite 140. In one non-limiting example, the temperature may be at least 9000 Celsius, and for about 5 minutes. Heat-conducting layer 114 may have an electrical resistivity of at least 50 ohm-centimeters. FIG. 3 also shows removing mask 136 and a remaining portion of hydrocarbon-containing material 134 (FIG. 2) from an upper portion of trench 132, e.g., using known ashing techniques or an appropriate wet etch for the hydrocarbon-containing material, leaving polycrystalline graphite, heat-conducting layer 114.

Returning to FIG. 1, dielectric layer 112 is formed over polycrystalline graphite, heat-conducting layer 114 to finalize heat spreading isolation structure 110. Dielectric layer 112 may be formed by any appropriate deposition technique for the material selected. Dielectric layer 112 may include any currently-known or later developed substance for providing electrical insulation, and as examples may include: silicon nitride (Si$_3$N$_4$), silicon oxide (SiO$_2$)(shown), fluorinated SiO$_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. In one particular example, dielectric layer 112 may include silicon oxide.

FIG. 1 also shows subsequent processing including forming of gate conductor(s) 142 (three shown). Gate conductor(s) 142, in one non-limiting example, may include polysilicon. In another example, gate conductor(s) 142 may include a metal gate. Although shown as a single material for clarity, metal gates may include one or more conductive components for providing a gate terminal of a transistor. For example, metal gates may include a high dielectric constant (high-K) layer, a work function metal layer and a conductor layer (not all shown for clarity). The high-K layer may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The conductor layer may include any now known or later developed gate conductor such as copper (Cu). A gate cap (not shown) of, for example, a nitride may also be formed over the gates. Gate conductor(s) 142 may also include a spacer thereabout, e.g., of silicon nitride. Gate conductor(s) 142 may be formed using any now known or later developed IC fabrication technique over substrate 104, e.g., material deposition, photolithographic patterning using masks and etching, etc. Structure 100 includes active device 102 in the form a MOS transistor 144. As understood in the art, and as will be descried herein, where structure 100 is employed with a bipolar transistor 146 (FIG. 4), the active region structure and/or its subcomponents may vary.

Heat spreading isolation structure 110 can be provided in a large variety of alternative arrangements than shown in FIG. 1, some of which are illustrated and described hereafter.

Figure 5:
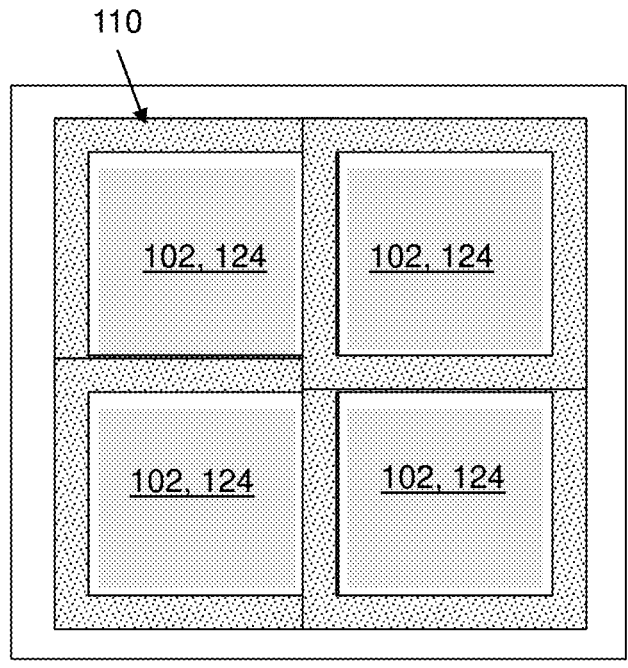
FIG. 5 shows a plan view of a structure including a heat spreading isolation structure, according to embodiments of the disclosure.

Heat spreading isolation structure 110 is adjacent active device 102. As shown in the plan views of FIGS. 5-6, heat spreading isolation structure 110 may also surround active device(s) 102. In FIG. 5, linked arrays of head spreading isolation structures 110 surround active regions 124, and in FIG. 6, individual heat spreading isolation structures 110 surround individual active regions 124. Any arrangement of active devices 102 or regions 124 can be electrically isolated by heat spreading isolation structure 110, similar to trench isolations.

Figure 4:
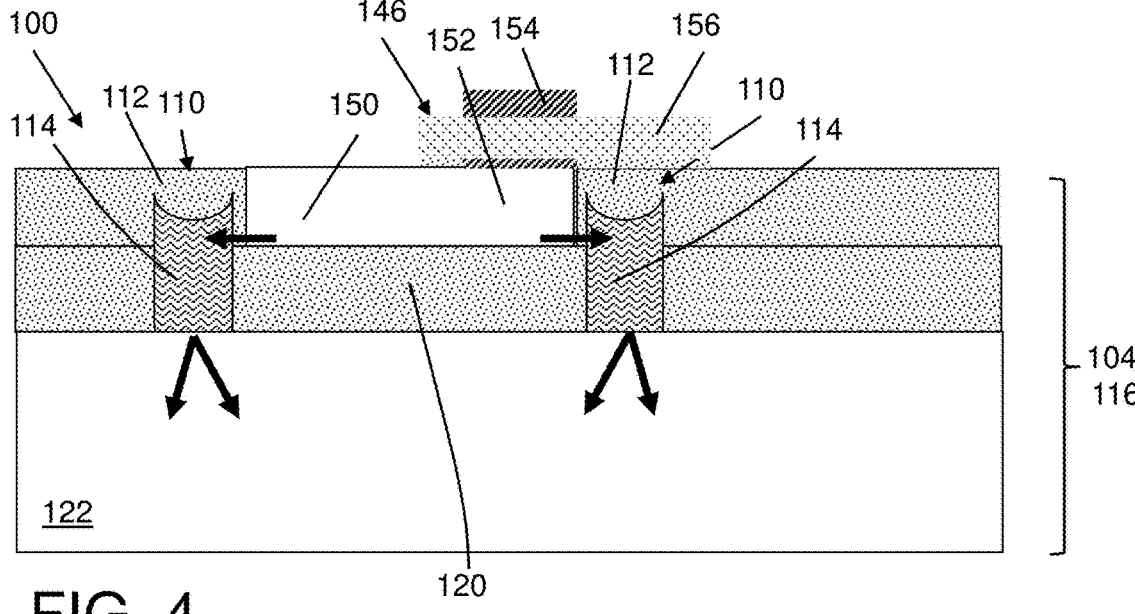
FIG. 4 shows a cross-sectional view of a structure including a heat spreading isolation structure in a bipolar junction transistor environment, according to embodiments of the disclosure.

As noted, FIG. 4 shows heat spreading isolation structure 110 used with bipolar transistor 146, and more specifically in this example, a bipolar junction transistor (BJT). Here, heat spreading isolation structures 110 extend to contact base semiconductor substrate 122 with one structure 110 adjacent a (left) part of collector 150 and another structure 110 adjacent another (right) part of collector 152. Emitter 154 is over base 156.

FIG. 7 shows a cross-sectional view of heat spreading isolation structure 110 in a MOS environment with heat-conducting layer 114 directly above buried insulating layer 120, i.e., contacting one another. In this case, trench 132 in FIG. 2 does not extend into or through buried insulating layer 120, but only to a surface thereof. FIG. 7 also shows a contact 160 adjacent to heat spreading isolation structure 110. Contacts 160 can be located anywhere space allows to provide additional thermal conductivity with minimal parasitic loss to adjacent active regions 124, and to, for example, base semiconductor substrate 122 and/or back-end-of-line interconnect layers (dashed box) above gate conductor(s) 142. Any number of contacts 160 can be provided. While not shown for clarity in all embodiments, contact(s) 160 provided for thermal conductivity can be employed in any embodiment described herein. Contacts 160 can be formed using any now known or later developed process, e.g., patterning a mask, etching contact openings to the respective depth, and forming a conductor in the openings. The conductor may include refractory metal liner, and a contact metal. The refractory metal liner (not labeled for clarity) may include, for example, ruthenium (Ru), tantalum (Ta), titanium (Ti), tungsten (W), iridium (Ir), rhodium (Rh) and platinum (Pt), etc., or mixtures of thereof. The contact metal may any now known or later developed contact metal such as but not limited to copper (Cu) or tungsten (W); or it may include polysilicon.

FIG. 7 also shows heat-conducting layer 114 having a wider extent than shown in FIG. 1. This configuration can be fabricated by widening portion 138 exposed by mask 136 from that shown in FIG. 2 to expose the entire width of trench 132. Hence, upon completion of the steps described relative to FIGS. 1-3, heat-conducting layer 114 extends the entire width of at least an upper portion of trench 132 in which hydrocarbon-containing material 134 is formed. As will be readily recognized, any width and/or depth of heat-conducting layer 114 can be formed according to the methods described herein.

Figure 8:
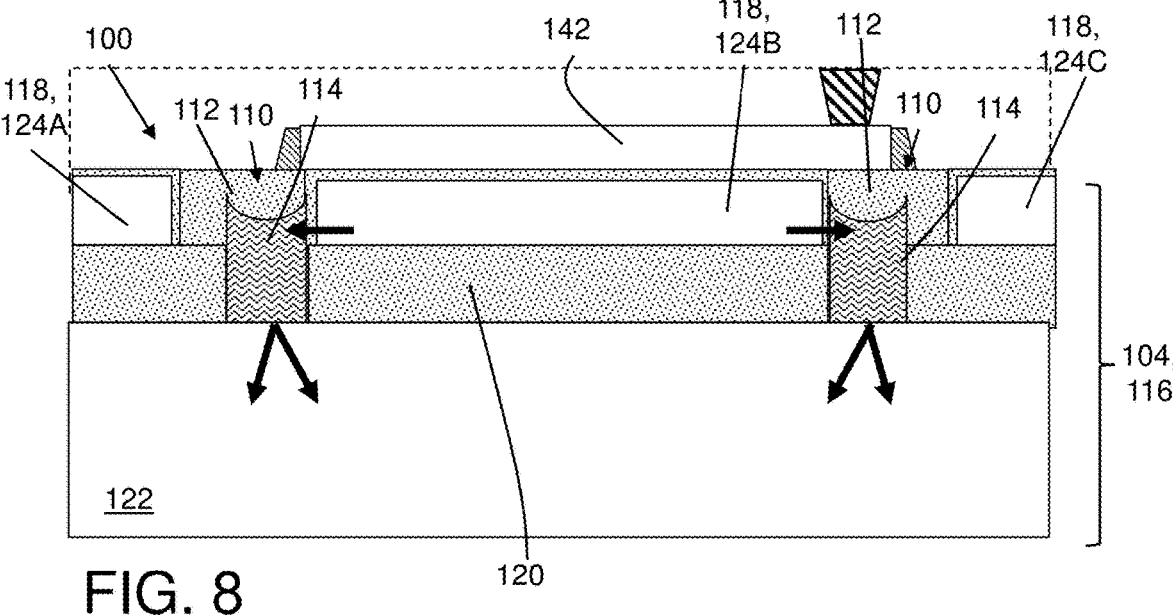
FIG. 8 shows a cross-sectional view of a structure including a heat spreading isolation structure with a wider gate conductor and with ends of the gate conductor extending over the heat spreading isolation structure, according to other embodiments of the disclosure.

FIG. 8 shows a cross-sectional view of heat spreading isolation structure 110 in a MOS environment similar to FIG. 1, but illustrating gate conductor(s) 142 can also be built over heat spreading isolation structure 110. Here, ends of gate conductor(s) 142 extend over heat spreading isolation structure 110.

Figure 9:
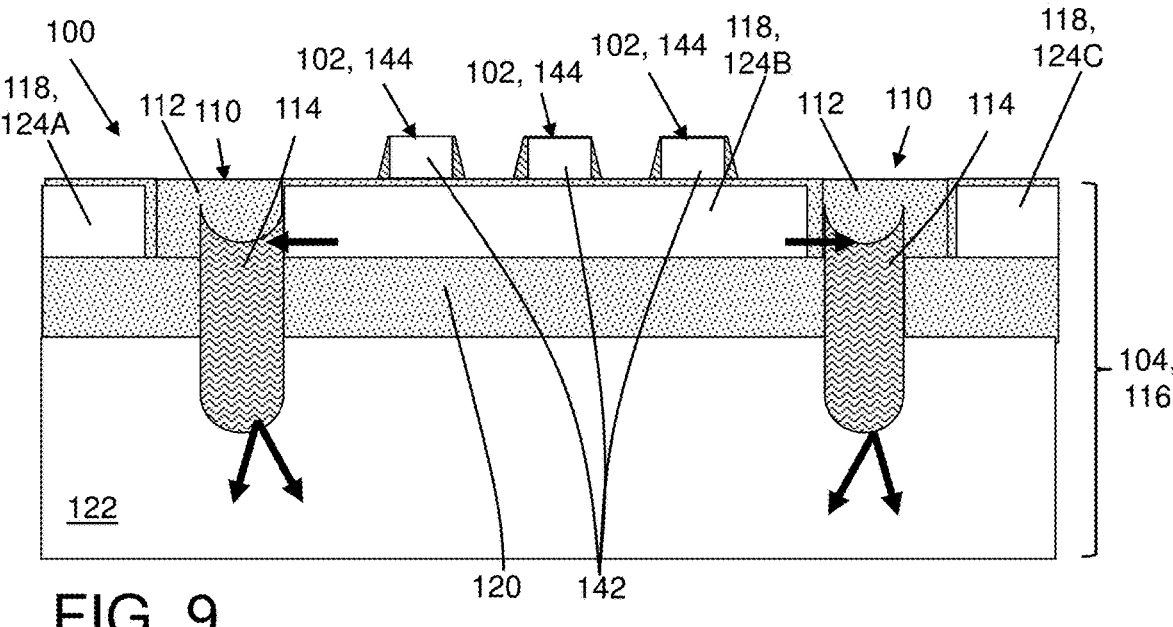
FIG. 9 shows a cross-sectional view of a structure including a heat spreading isolation structure extending into a base semiconductor substrate of an SOI substrate, according to yet other embodiments of the disclosure.
Figure 10:
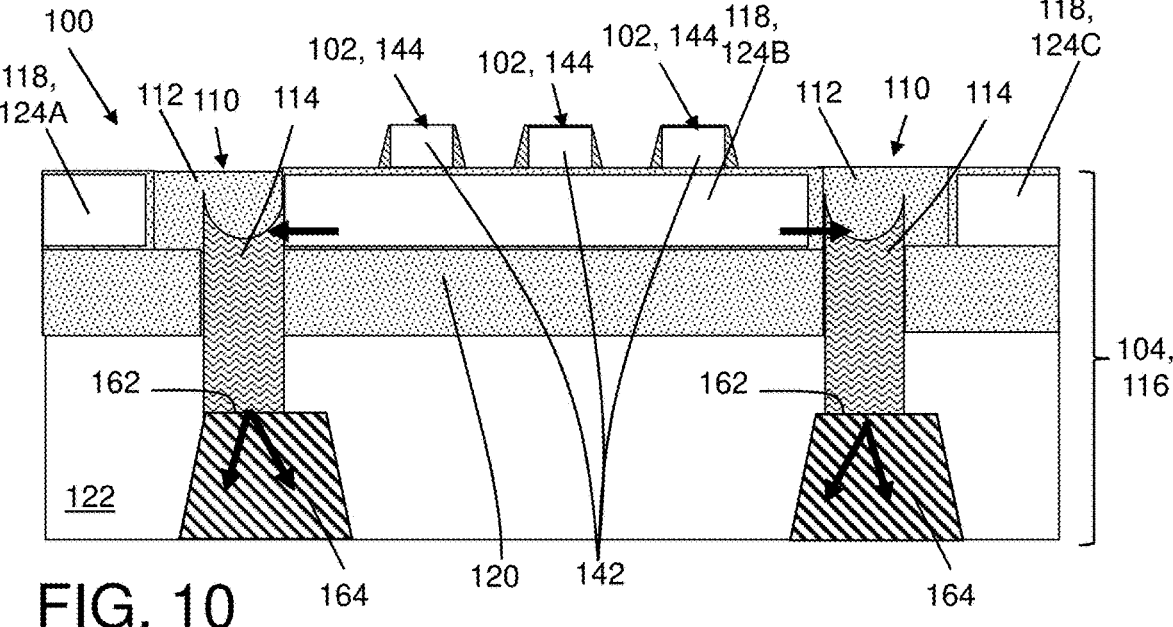
FIG. 10 shows a cross-sectional view of a structure including heat spreading isolation structures thermally coupled to through silicon vias, according to embodiments of the disclosure.
Figure 11:
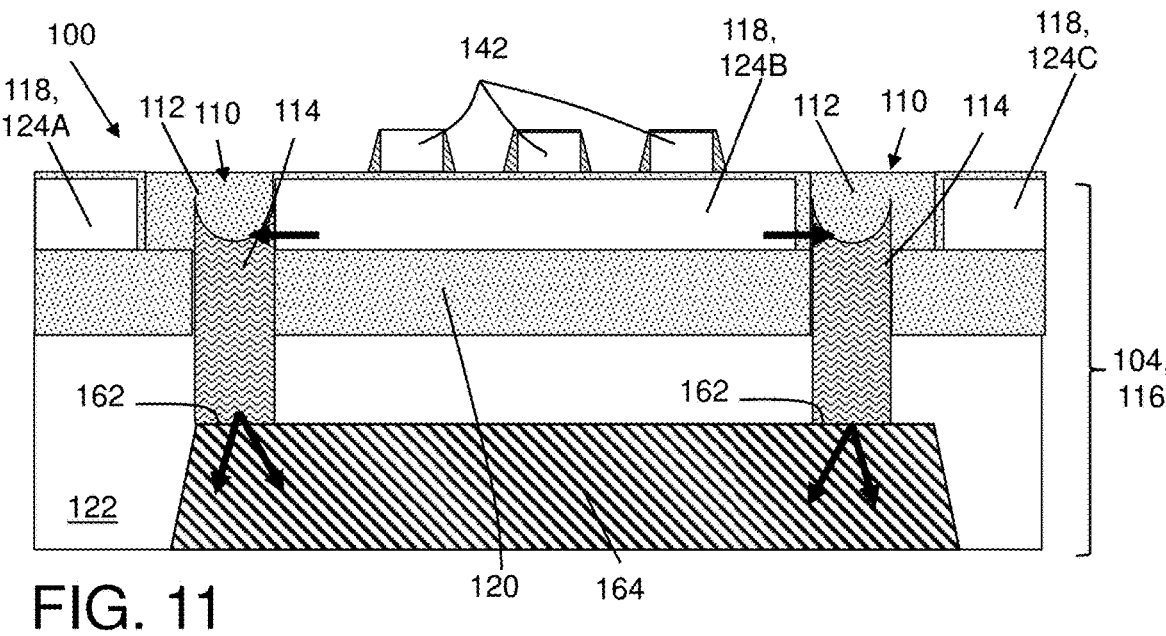
FIG. 11 shows a cross-sectional view of a structure including heat spreading isolation structures thermally coupled to a through silicon via, according to other embodiments of the disclosure.

FIGS. 9-11 show cross-sectional views of heat spreading isolation structure 110 in a MOS environment with heat-conducting layer 114 extending into base semiconductor substrate 122. Here, heat-conducting layer 114 may conduct heat directly into base semiconductor substrate 122. FIG. 9 shows heat-conducting layer 114 extending into base semiconductor substrate 122, and that a lower surface 162 of heat-conducting layers 114 may be non-planar;

FIG. 10 shows two heat spreading isolation structures 110 with their heat conducting layers 114 extending into base semiconductor substrate 122 with the lower surface 162 of heat-conducting layers 114 each contacting a respective through semiconductor via (TSV) 164 in base semiconductor substrate 122; and FIG. 11 shows two heat spreading isolation structures 110 with their heat-conducting layers 114 extending into base semiconductor substrate 122 with a lower surface 162 of heat-conducting layers 114 contacting a single TSV 164 in base semiconductor substrate 122. TSV(s) 164 provide additional thermal conductivity through and/or out of base semiconductor substrate 122. TSVs 164 can be formed using any now known or later developed process. Any arrangement of heat-conducting layers 114 contacting TSV(s) 164 may be employed. The formation of heat-conducting layer 114 in the FIGS. 9-11 embodiments may require multiple applications of hydrocarbon-containing material 134 with the trench(es) and implanting thereof (as described relative to FIGS. 2-3) to achieve the desired thickness.

Figure 12:
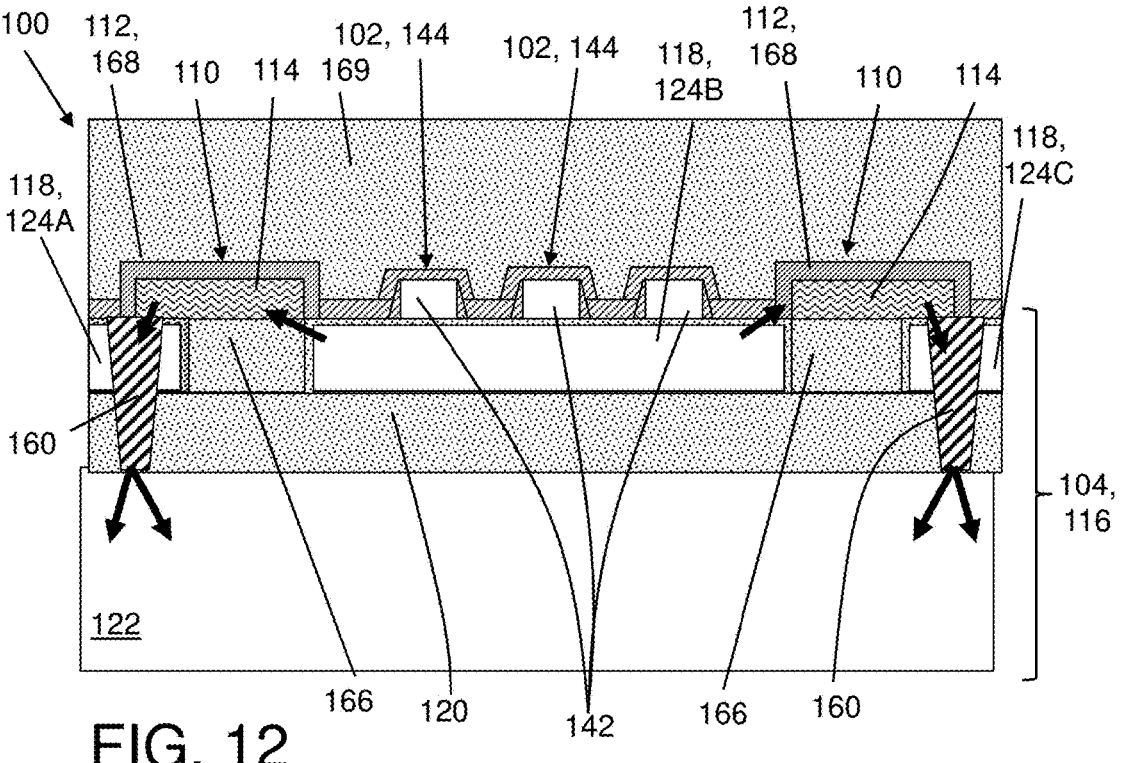
FIG. 12 shows a cross-sectional view of a structure including a heat spreading isolation structure over an SOI layer of an SOI substrate, according to yet other embodiments of the disclosure.

FIG. 12 shows a cross-sectional view of another embodiment in which heat spreading isolation structure 110 is over trench isolations 166 (e.g., of silicon oxide) between active regions 124A-C in SOI layer 118. Here, dielectric layer 112 is formed by a nitride layer 168 over heat-conducting layer 114. Contacts 160 may provide additional thermal conductivity to base semiconductor substrate 122 below, and/or BEOL layers 169 above. The FIG. 12 embodiment can be formed similar to that described relative to FIGS. 1-3, but without trench(es) 132 and with hydrocarbon-containing material 134 being formed over trench isolations 166. Mask 136 in FIG. 2 would expose portions 138 of any desired width over SOI layer 118 and trench isolations 166 therein.

Figure 13:
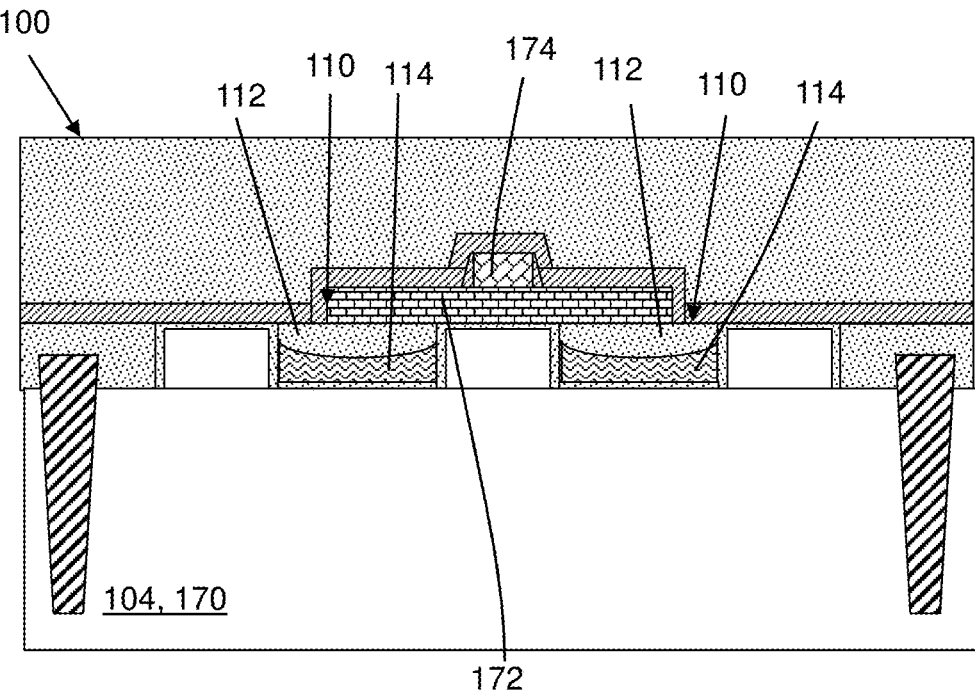
FIG. 13 shows a cross-sectional view of a structure including a heat spreading isolation structure in a bipolar environment and over a bulk semiconductor substrate, according to additional embodiments of the disclosure.
Figure 14:
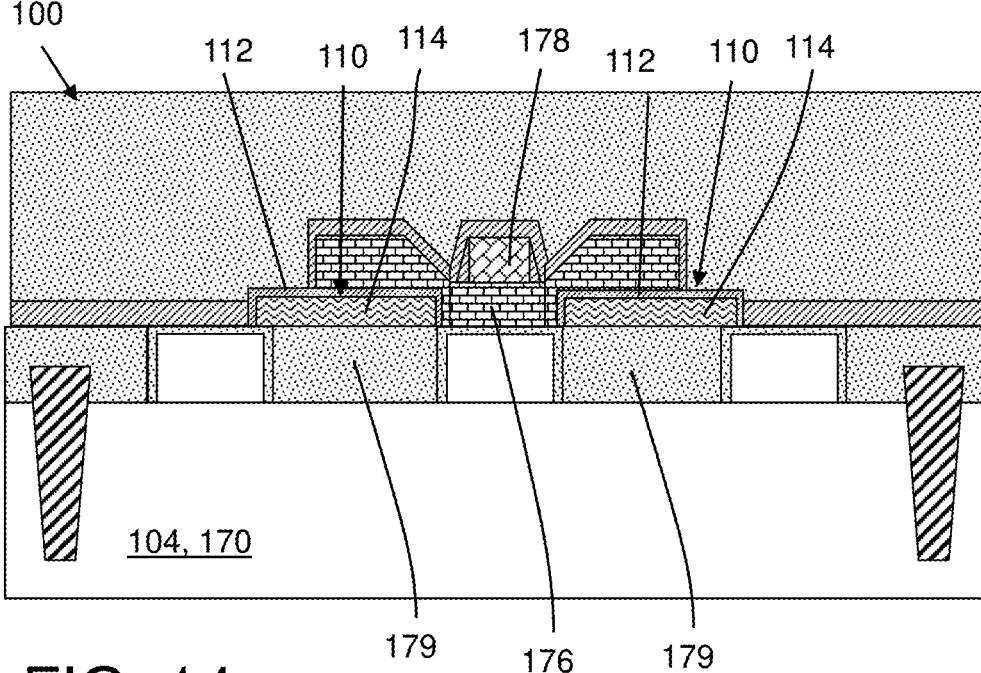
FIG. 14 shows a cross-sectional view of a structure including a heat spreading isolation structure in a bipolar environment and over a bulk semiconductor substrate, according to embodiments of the disclosure.
Figure 15:
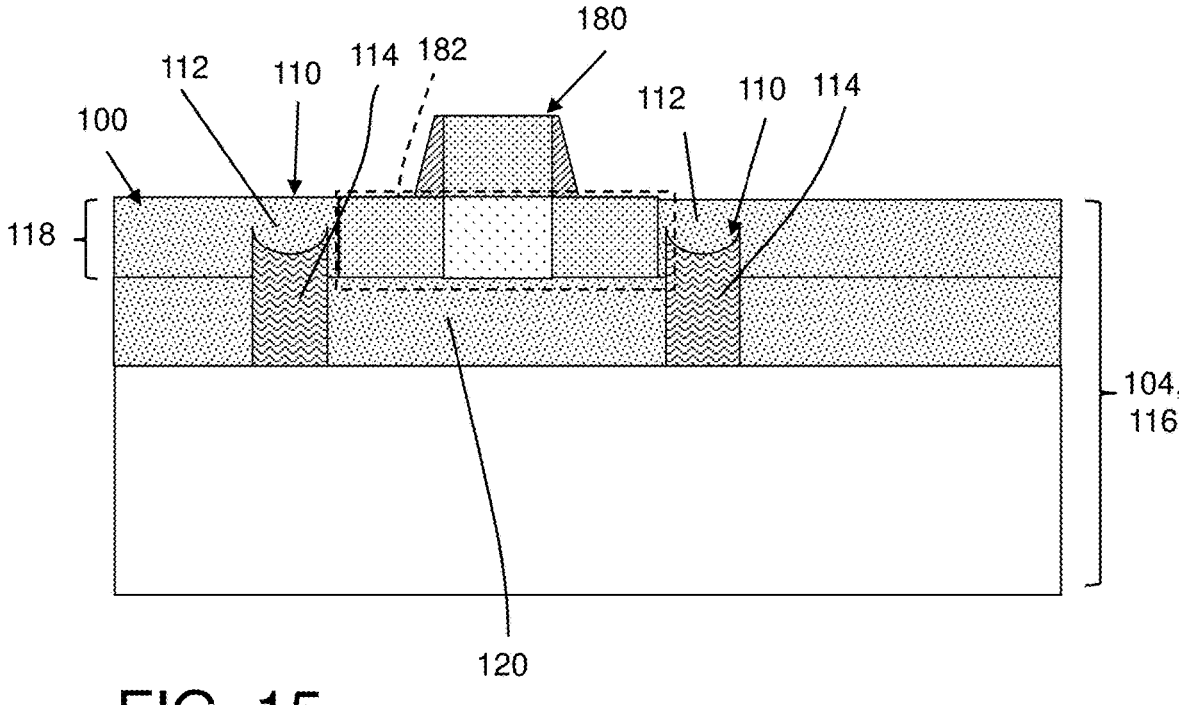
FIG. 15 shows a cross-sectional view of a structure including a heat spreading isolation structure in a lateral bipolar environment and over an SOI substrate, according to other embodiments of the disclosure.

FIGS. 13-15 show cross-sectional views of other embodiments of heat spreading isolation structure 110 in bipolar environment over a bulk semiconductor substrate 170. FIG. 13 shows heat spreading isolation structures 110 under a base 172 with an emitter 174 thereover, and over bulk semiconductor substrate 170. FIG. 14 shows heat spreading isolation structures 110 under a base 176 with an emitter 178 thereover, and over trench isolations 179 over bulk semiconductor substrate 170. FIG. 15 shows heat spreading isolation structures 110 in an SOI substrate 116 with a lateral bipolar transistor 180 and adjacent an NPN section 182 (dashed box) thereof. NPN section 182 is in SOI layer 118 (shown mostly replaced by trench isolations and NPN section 182) of SOI substrate 116.

Figure 6:
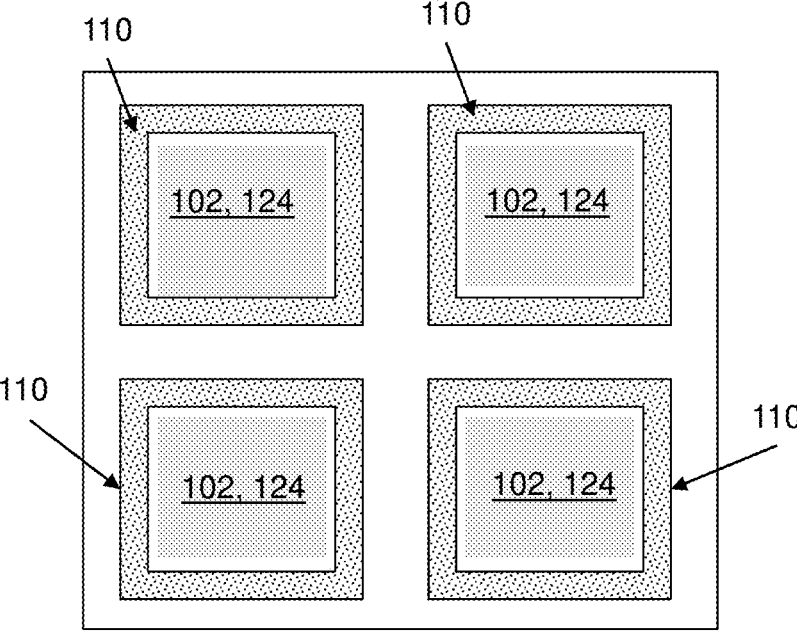
FIG. 6 shows a plan view of a structure including a heat spreading isolation structure, according to other embodiments of the disclosure.

As shown in FIG. 1, embodiments also include heat spreading isolation structure 110 including, in a trench 132 in substrate 104 and adjacent active device 102 on the substrate, a body 190 including: dielectric layer 112, and polycrystalline graphite, heat-conducting layer 114 below dielectric layer 112. As described herein, substrate 104 may be in the form of SOI substrate 116 and include SOI layer 118 over buried insulating layer 120 over base semiconductor substrate 122. Alternatively, substrate 104 may include a bulk semiconductor substrate 170 (FIGS. 13-14). Body 190 may extend through buried insulating layer 120, and as shown in FIGS. 5-6, may surround active device(s) 102. Alternatively, body 190 may be over buried insulator layer 120, or through it to contact substrate 104 (e.g., base semiconductor substrate 122), or through it and into substrate 104. As shown in FIGS. 10-11, lower surface 162 of the polycrystalline graphite, heat-conducting layer(s) 114 may contact TSV(s) 164 in substrate 104, e.g., base semiconductor substrate 122. Polycrystalline graphite, heat-conducting layer 114 may have an electrical resistivity of at least approximately 50 ohm-centimeters.

While discrete embodiments of the disclosure have been described herein, it is emphasized that the various features of each embodiment can be used in the other embodiments to arrive at arrangements not expressly described herein, but within the scope of the disclosure.

Embodiments of heat spreading isolation structure 110 provide short path conduction through dielectrics without the electrical/parasitic cost of other solutions. More specifically, polycrystalline graphite, heat-conducting layer 114 provides a heat sink material adjacent to active devices in SOI or bulk substrates. Heat-conducting layer 114 can be created in a wide variety of locations and arrangements, e.g., a ring on or within buried insulating layer 106 and/or around active device(s), to conduct heat away from the device and perhaps towards contacts in thermal communication with base substrates and/or BEOL layers. In any event, thermal conduction has a shorter path through dielectrics through better thermal conductors with minimal electrical/parasitic loss.

The method as described above is used in the fabrication of integrated circuit chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
an active device over an area of a substrate, the substrate including a semiconductor-on- insulator (SOI) layer over a buried insulating layer over a base semiconductor substrate; and
a heat spreading isolation structure adjacent the active device, wherein the heat spreading isolation structure includes a dielectric layer above and abutting an upper surface of a polycrystalline graphite, heat-conducting layer, and wherein an upper surface of the polycrystalline graphite, heat-conducting layer is concave and a lowermost surface of the polycrystalline graphite, heat-conducting layer extends into the base semiconductor substrate; and
a heat spreading through semiconductor via (TSV) adjacent to the heat spreading isolation structure and located within the base semiconductor substrate, wherein a bottom surface of the polycrystalline graphite, heat-conducting layer within the base semiconductor substrate contacts an upper surface of the heat spreading TSV within the base semiconductor substrate.

2. The structure of claim 1, wherein the heat spreading isolation structure is in-between two portions of the SOI layer.

3. The structure of claim 1, wherein the heat-conducting layer is directly above the buried insulating layer.

4. The structure of claim 1, wherein the heat spreading isolation structure extends through the buried insulating layer.

5. The structure of claim 1, wherein the heat-conducting layer has an electrical resistivity of at least 50 ohm-centimeters.

6. The structure of claim 1, wherein the active device is a metal-oxide semiconductor (MOS) transistor.

7. The structure of claim 1, wherein the active device is a bipolar transistor.

8. The structure of claim 1, wherein the heat spreading isolation structure surrounds the active device.

9. A heat spreading isolation structure, comprising:
a substrate including a semiconductor-on-insulator (SOI) layer over a buried insulating layer over a base semiconductor substrate;
in a trench in the substrate, the trench adjacent an active device on the substrate and adjacent the SOI layer, a body including:
a dielectric layer; and
a polycrystalline graphite, heat-conducting layer below the dielectric layer an extending into the base semiconductor layer, wherein an upper surface of the polycrystalline graphite, heat-conducting layer is not planar, wherein the body surrounds the active device, and wherein a lower surface of the polycrystalline graphite, heat- conducting layer in the base semiconductor layer is non-planar.

10. The heat spreading isolation structure of claim 9, wherein the body extends through the buried insulating layer.

11. The heat spreading isolation structure of claim 10, wherein the polycrystalline graphite, heat-conducting layer has an electrical resistivity of at least 50 ohm-centimeters.

12. The heat spreading isolation structure of claims 9, further comprising:
an additional active device over a different area of the substrate from the active device; and
an additional body surrounding the additional active device, the additional body including:
a dielectric layer; and
a polycrystalline graphite, heat-conducting layer below the dielectric layer,
wherein an upper surface of the polycrystalline graphite, heat-conducting layer is not planar.

13. The heat spreading isolation structure of claim 12, wherein the body and the additional body are physically separated by a distance.

14. The heat spreading isolation structure of claim 9, wherein the body is adjacent a first side of an active device over the substrate, and the TSV thermally connects the body to an additional body adjacent a second side of the active device.

\* \* \* \* \*